(12) United States Patent
Gao et al.

(10) Patent No.: US 7,544,569 B2
(45) Date of Patent: Jun. 9, 2009

(54) BIDIRECTIONAL SPLIT GATE NAND FLASH MEMORY STRUCTURE AND ARRAY, METHOD OF PROGRAMMING, ERASING AND READING THEREOF, AND METHOD OF MANUFACTURING

(75) Inventors: Feng Gao, Sunnyvale, CA (US); Ya-Fen Lin, Santa Clara, CA (US); John W. Cooksey, Brentwood, CA (US); Changyuan Chen, Sunnyvale, CA (US); Yuniarto Widjaja, San Jose, CA (US); Dana Lee, Santa Clara, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 490 days.

(21) Appl. No.: 11/516,431

(22) Filed: Sep. 5, 2006

(65) Prior Publication Data

US 2007/0020853 A1    Jan. 25, 2007

Related U.S. Application Data

(62) Division of application No. 11/134,557, filed on May 20, 2005, now Pat. No. 7,247,907.

(51) Int. Cl.
 *H01L 21/336* (2006.01)
(52) U.S. Cl. .................. 438/266; 438/257; 438/258; 438/261; 438/262; 438/264; 438/287; 438/288; 438/622; 438/672; 257/E21.679; 257/E21.681
(58) Field of Classification Search ............... 438/262, 438/288; 257/320
See application file for complete search history.

(56) References Cited

U.S. PATENT DOCUMENTS

| 4,099,196 | A | * | 7/1978 | Simko | 257/317 |
| 4,964,143 | A | * | 10/1990 | Haskell | 257/316 |
| 5,029,130 | A | | 7/1991 | Yeh | |
| 5,364,806 | A | * | 11/1994 | Ma et al. | 438/266 |
| 5,801,412 | A | * | 9/1998 | Tobita | 257/296 |
| 6,151,248 | A | | 11/2000 | Harari et al. | |

(Continued)

OTHER PUBLICATIONS

C.Y. Shu et al., Split-Gate NAND Flash Memory At 120 nm Technology Node Featuring Fast Programming And Erase, 2004 Symposium, VLSI Technology Digest of Technical Papers, pp. 78-79.

*Primary Examiner*—N Drew Richards
*Assistant Examiner*—Kyoung Lee
(74) *Attorney, Agent, or Firm*—DLA Piper LLP (US)

(57) ABSTRACT

A split gate NAND flash memory structure is formed on a semiconductor substrate of a first conductivity type. The NAND structure comprises a first region of a second conductivity type and a second region of the second conductivity type in the substrate, spaced apart from the first region, thereby defining a channel region therebetween. A plurality of floating gates are spaced apart from one another and each is insulated from the channel region. A plurality of control gates are spaced apart from one another, with each control gate insulated from the channel region. Each of the control gate is between a pair of floating gates and is capacitively coupled to the pair of floating gates. A plurality of select gates are spaced apart from one another, with each select gate insulated from the channel region. Each select gate is between a pair of floating gates.

14 Claims, 7 Drawing Sheets

U.S. PATENT DOCUMENTS

| | | |
|---|---|---|
| 6,268,622 B1 * | 7/2001 | Shone et al. ................ 257/314 |
| 6,337,245 B1 * | 1/2002 | Choi ........................ 438/258 |
| 6,512,262 B2 * | 1/2003 | Watanabe .................. 257/316 |
| 6,825,084 B2 | 11/2004 | Ogura et al. |
| 6,911,690 B2 * | 6/2005 | Hsu et al. .................. 257/315 |
| 2001/0020718 A1 * | 9/2001 | Takahashi et al. .......... 257/326 |
| 2003/0057474 A1 * | 3/2003 | Ma et al. .................... 257/314 |
| 2004/0161881 A1 * | 8/2004 | Shin et al. .................. 438/128 |
| 2006/0017085 A1 * | 1/2006 | Tuntasood et al. .......... 257/296 |

* cited by examiner

BIDIRECTIONAL SPLIT GATE NAND FLASH MEMORY STRUCTURE AND ARRAY, METHOD OF PROGRAMMING, ERASING AND READING THEREOF, AND METHOD OF MANUFACTURING

CROSS-REFERENCE TO RELATED APPLICATIONS

This application is a divisional application of U.S. patent. application Ser. No. 11/134,557 filed on May 20, 2005, now U.S. Pat. No. 7,247,907 the subject matter of which is incorporated herein by reference.

TECHNICAL FIELD

The present invention relates to a split gate NAND flash memory structure and more particularly to a bi-directional split gate NAND flash memory structure having only a source and drain at the ends of the NAND flash memory structure.

BACKGROUND OF THE INVENTION

Non-volatile memory integrated circuit chips are well known in the art. See for example U.S. Pat. Nos. 5,029,130 and 6,151,248. One form of a non-volatile memory integrated circuit chip is a "NAND" flash memory device in which a string of serially connected non-volatile memory cells are grouped in a NAND flash memory structure.

Referring to FIG. 1A there is shown a cross-sectional view of a prior art split gate NAND flash memory structure 10. (See "Split-Gate NAND Flash Memory At 120 nm Technology Node Featuring Fast Programming and Erase" by C. Y. Shu et al, 2004 symposium on VLSI Technology Digest of Technical Papers, p. 78-79). The NAND flash memory structure 10 is formed on a semiconductor substrate 12 of a first conductivity type. The NAND flash memory structure 10 has a first region 14 of a second conductivity type and a second region 16 of the second conductivity type in the substrate 12. The first region 14 and the second region 16 are spaced apart from one another to define a continuous channel region between the first region 14 and the second region 16. A plurality of floating gates (18A . . . 18N) are spaced apart from one another with each floating gate 18 positioned over a separate portion of the channel region and separated and insulated therefrom. The structure 10 further has a select gate 20 associated with each floating gate 18. The select gate 20 is positioned over another portion of the channel region, and is immediately adjacent to the associated floating gate 18 and is insulated therefrom. Finally, the structure 10 has a plurality of control gates 22 with each control gate 22 associated with a floating gate 18 and forming a stacked gate configuration with the associated floating gate 18.

Typically, the NAND gate structure 10 is formed in a column direction with the select gate 20 and the control gate 22 connecting the respective select gates and control gates in a row direction. A plan view of an array of such NAND structures 10 is shown in FIG. 1B.

The problem with the NAND structure. 10 of the prior art is that it requires two row lines for each cell: one for the select gate 20 and one for the control gate 22. With two lines for each cell and where for non-volatile memory cells the lines must carry high voltages, there would be too many high voltage control lines required for the pitch of each cell. In addition, the NAND structure 10 is uni-directional in operation.

Memory arrays in which the adjacent rows/columns are electrically connected at ends of the array are well known. See, e.g. U.S. Pat. No. 6,825,084 (FIG. 2). Finally, control gates that are substantially T shaped positioned between a pair of floating gates and having a portion over a channel region, and capacitively coupled to the pair of floating gates is also well known in the art. See e.g. U.S. Pat. No. 6,151,248.

Accordingly, there is a need to reduce the line count per cell to thereby improve the pitch of the nonvolatile memory device.

SUMMARY OF THE INVENTION

Accordingly, in the present invention, a NAND flash memory structure is formed on a semiconductor substrate of a first conductivity type. The NAND structure comprises a first region of a second conductivity type in the substrate and a second region of the second conductivity type in the substrate, spaced apart from the first region. Thus, a channel region is defined between the first region and the second region. A plurality of floating gates are spaced apart from one another with each insulated from the channel region. A plurality of control gates are spaced apart from one another with each insulated from the channel region. Each control gate is between a pair of floating gates and is capacitively coupled to the pair of floating gates. A plurality of select gates are spaced apart from one another with each insulated from the channel region. Each select gate is between a pair of floating gates.

DETAILED DESCRIPTION OF THE INVENTION

Figure 1A:
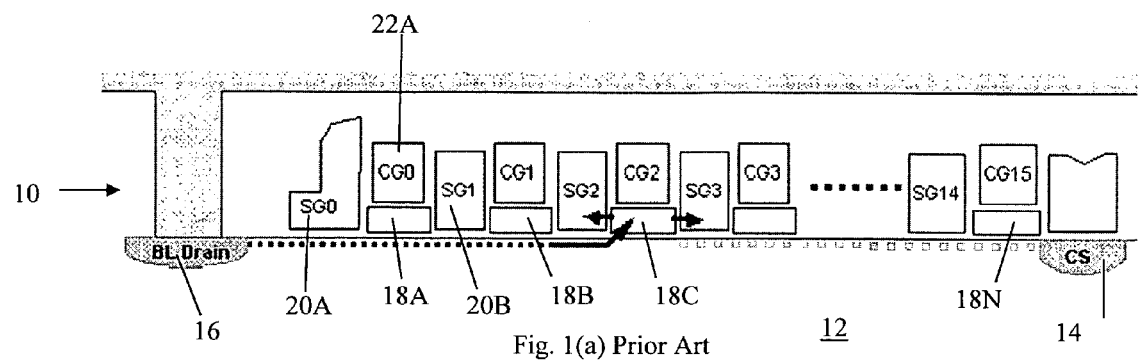
FIG. 1A is a schematic cross-sectional view of a NAND flash memory structure of the prior art.
Figure 1B:
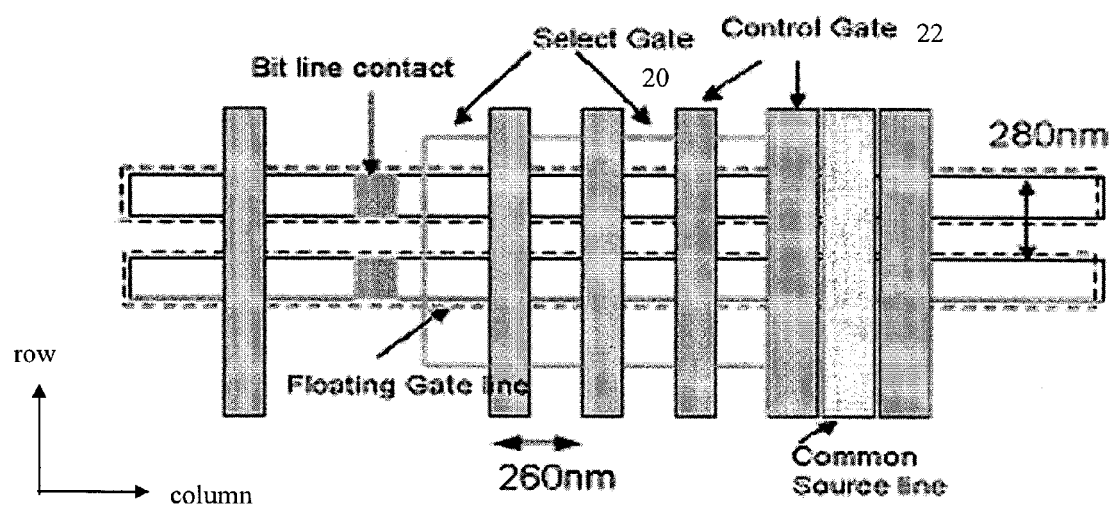
FIG. 1B is a top view of a NAND flash memory device using a plurality of NAND flash memory structures of the prior art shown in FIG. 1A showing the interconnection of one NAND flash memory structure to an adjacent NAND flash memory structure.
Figure 2:
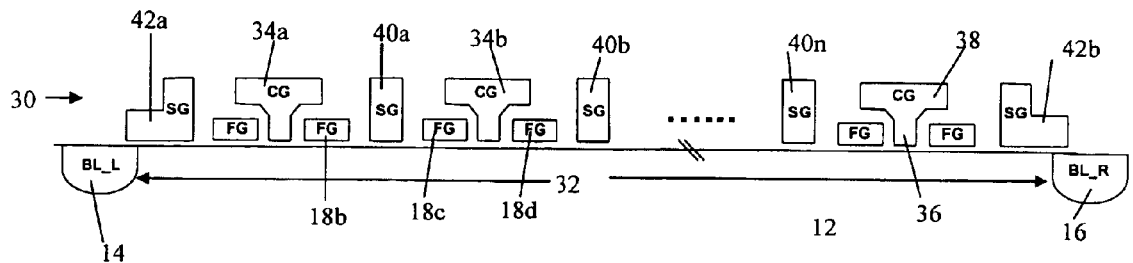
FIG. 2 is a schematic cross-sectional view of one embodiment of a NAND flash memory structure of the present invention.

Referring to FIG. 2 there is shown a cross-sectional view of a first embodiment 30 of a NAND flash memory structure 30 of the present invention. The NAND flash memory structure 30 shown in FIG. 2 is formed on a semiconductor substrate 12 of a first conductivity type, such as P-type. The structure 30 has a first region 14 of a second conductivity type, such as N type, as, a source, in the substrate 12. Spaced apart from the first region 14 or the source 14 is a second region 16, such as a drain, also of the second conductivity type, in the substrate 12. As used herein, the term "source" and "drain" may be used interchangeably. As will be disclosed hereinafter, the operation of the NAND flash memory structure 30 of the present invention can be operated with the source 14 and the drain 16 interchanged, i.e. the structure 30 can operate bi-directionally. The first region 14 and the second region 16 are spaced apart from one another to define a continuous channel region 32 there between. A plurality of floating gates 18 are spaced apart from one another and are positioned above the channel region 32 and is insulated therefrom. Each floating gate 18 is positioned over a separate portion of the channel region 32 and controls the conduction of the current in the channel region portion over which the floating gate 18 is positioned. The NAND flash memory structure 30 also comprises a plurality of controls gates 34. Each control gate 34 is associated with and is positioned between a pair of floating gates 18. Each control gate 34 has two portions: a first portion 36 which is over a portion of the channel region 32 adjacent to the associated floating gates 18 and a second portion 38 over the associated floating gates 18 and insulated therefrom and is capacitively coupled to the floating gates 18. The control gate 34 can be a unitary structure as shown in FIG. 2 or the two portions 36 and 38 can be separate portions but electrically connected ex situ, i.e. electrically outside of the NAND flash memory structure 30. In the embodiment shown in FIG. 2, the NAND flash memory structure 30 also comprises a first select gate 40 positioned over a portion of the channel region 32 and insulated therefrom. Each first select gate 40 is associated with and is positioned between a pair of floating gates 18. Thus, each floating gate 18 has an associated control gate 34 to one side and an associated select gate 40 to another side. Each select gate 40 is substantially rectilinearly shaped. The select gate 40 functions as a gate of a conventional MOS transistor. Finally, the NAND flash memory structure 30 also has two second select gates 42, with each positioned over a portion of the channel region 32 and insulated therefrom, and immediately adjacent to the source region 14 and the drain region 16, respectively. Each of the second select gates 42 is substantially "L" shaped.

Array of NAND Flash Memory Structures

Figure 3:
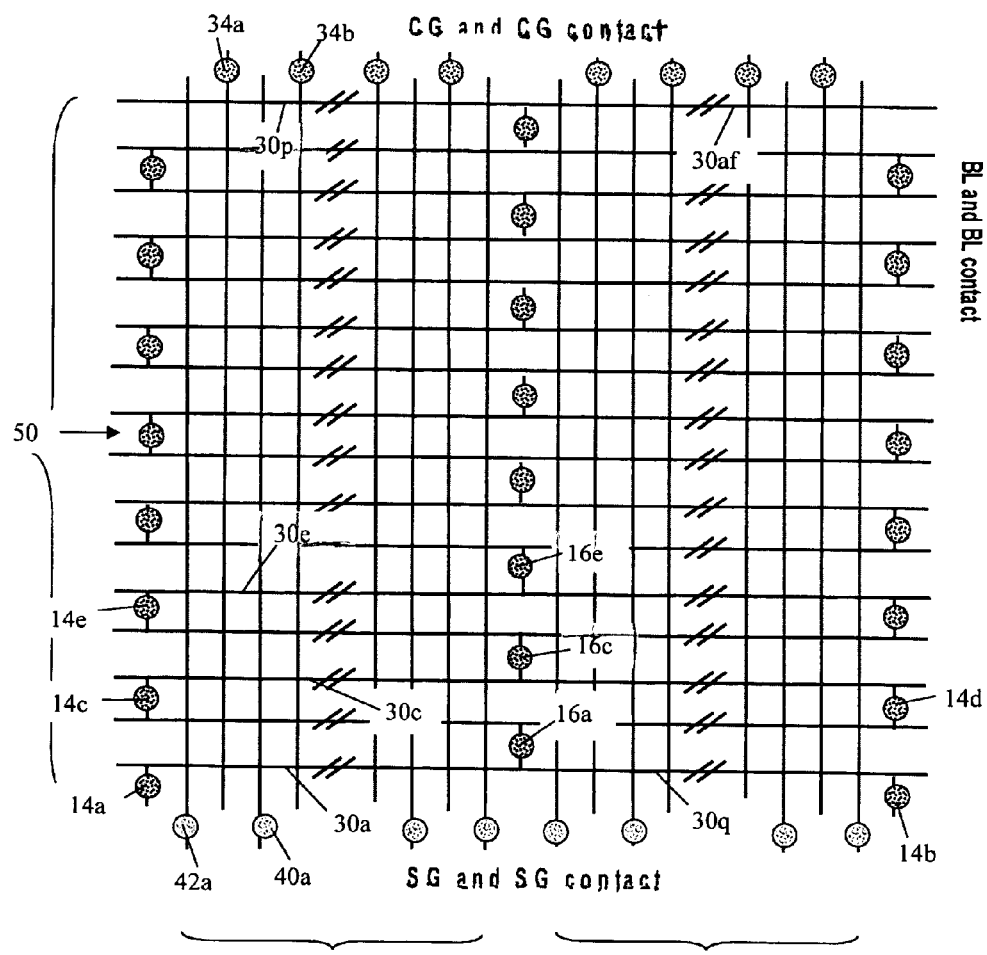
FIG. 3 is a top view of a NAND array using a plurality of NAND flash memory structures of the type shown in FIG. 2.

Referring to FIG. 3 there is shown a top view of an array 50 of NAND flash memory structures 30. The array 50 comprises a plurality of NAND flash memory structures 30 arranged in a plurality of rows and columns. As is well known to those in the art, the term row and column may be used interchangeably. In the embodiment shown in FIG. 3, each NAND flash memory structure 30 is arranged in the column direction, with the source region 14 at one end and the drain region 16 at another end. Further, each NAND flash memory structure 30 in a column shares a common drain region 16 with another NAND flash memory structure at one end and shares a common source region 14 at another end. Finally, as can be seen from FIG. 3, NAND Flash memory structures that are adjacent to one another in the row direction also share a common source region 14. Thus, the NAND structure 30a has a source region 14a and a drain region 16a. The NAND structure 30b, which is immediately adjacent to the structure 30a in a row direction shares the common drain region 16a, and has a source region 14c. The source region 14c, however, is also shared with an adjacent structure 30c, in the row direction. Finally, the first select gates 40 and the second select gates 42 and the control gates 34 are laid out in the row direction.

Figure 4:
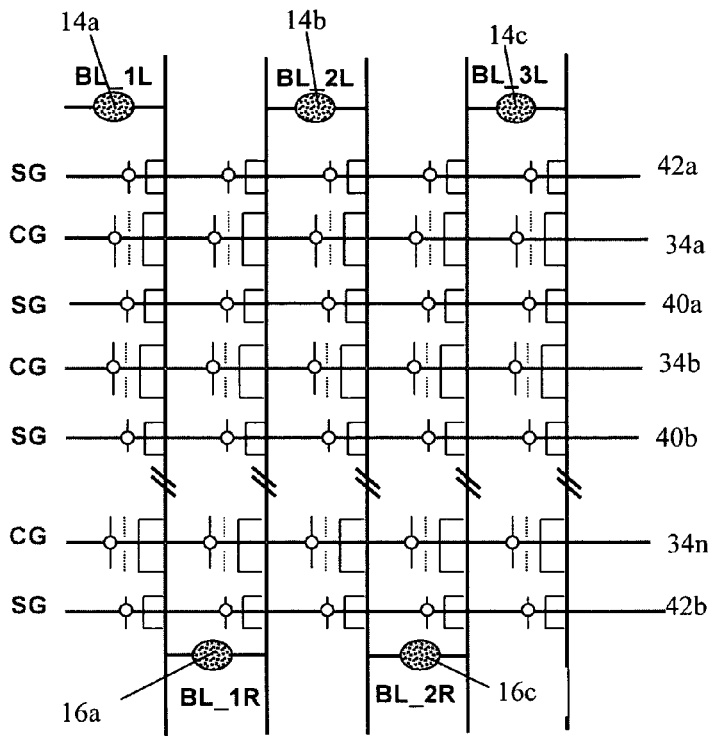
FIG. 4 is a schematic circuit diagram view of the NAND array shown in FIG. 3.

A schematic circuit diagram of the array 50 is shown in FIG. 4. Each first select gate 40 and second select gate 42 acts as a conventional gate of an MOS transistor, in that a voltage applied to that gate can turn on the portion of the channel region underneath the gate. Each control gate 34 acts as a control gate of a stack floating gate transistor. The voltage applied to the control gate, if sufficient to overcome the charges stored on the associated floating gate, can turn on the portion of the channel region underneath the floating gate.

Method of Manufacturing

Figure 5:
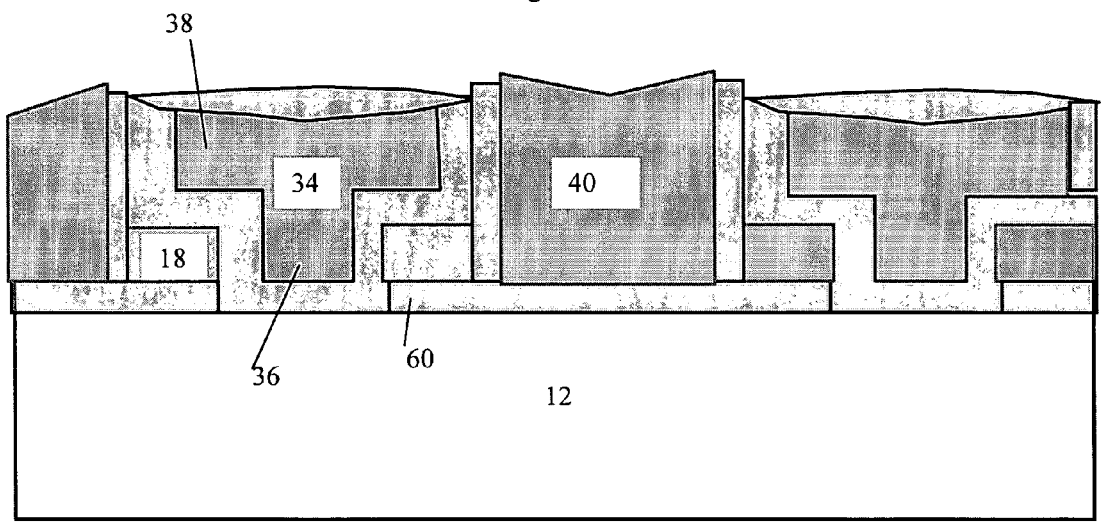
FIG. 5 is a cross-sectional view of a portion of the NAND flash memory structure of the present invention shown in FIG. 2.

Referring to FIG. 5, there is shown a cross-sectional view of a portion of the NAND flash memory structure 30 of the present invention. The structure 30 comprises a silicon substrate 12, which typically is of P type. However, as it is well known to those skilled in the arty, that the substrate may also be N type. The portion of the structure 30 also comprises a floating gate oxide layer 60 on the substrate 12. A pair of floating gates 18 are on the oxide layer 60. Between the pair of floating gates 18 is the first portion 36 of the control gate 34. The first portion 36 of the control gate 34 is also insulated from the substrate 12. Each of the two second portions 38 of the control gate 34 extends over the pair of floating gates 18 and is capacitively coupled thereto. The select gate 40 is between a pair of floating gates 18.

Figure 6A:
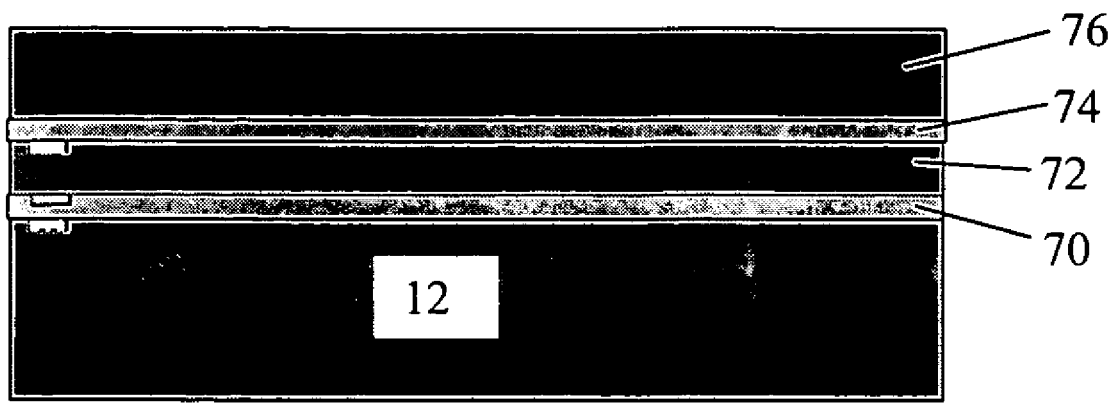
FIGS. 6A-6E show the steps in making the portion of the NAND flash memory structure of the present invention shown in FIG. 5.

The portion of the NAND flash memory structure 30 shown in FIG. 5 can be made by the following process steps. Referring to FIG. 6A there is shown a single crystalline silicon substrate 12, on which is grown a layer of silicon dioxide 70. The layer of silicon dioxide is approximately ninety (90) angstroms in thickness. As will be apparent to those skilled in the art, the dimensions described herein are for a certain geometry size of the NAND structure 30. In the present case, the description is for a device having one hundred thirty (130) nm feature size. The layer of silicon dioxide 70 can be grown by thermal oxidation of silicon or it can be a deposited dielectric. A layer of polysilicon 72 of approximately five hundred (500) angstroms is then deposited on the layer of silicon dioxide 70. The layer of polysilicon 72 can be deposited by low pressure chemical vapor deposition (LPCVD). The polysilicon 72 is then subjected to a high temperature oxidation (HTO) treatment, in which a layer of silicon dioxide 74 is deposited. Approximately one hundred fifty (150) angstroms of silicon dioxide 74 is deposited. Finally, a layer of silicon nitride 76 of approximately two thousand (2000) angstroms in thickness is then deposited on the layer of silicon dioxide 74. The layer of silicon nitride 76 can be deposited by LPCVD. The resultant structure is shown in FIG. 6A.

The structure shown in FIG. 6A is then subject to a photomasking operation in which select portions of the silicon nitride layer 76 is covered by photoresist and then exposed by an appropriate mask. The mask is removed, with the unexposed photoresist removed. The structure is then subjected to a silicon nitride RIE etch removing the silicon nitride 76 that is not covered by the photoresist. The etch continues until it reaches the layer 74 of silicon dioxide. The photoresist that remains covering the silicon nitride 76 is then removed. A layer of silicon dioxide 78 (TEOS) is then deposited on the structure. The layer 78 of TEOS is approximately one thousand (1000) angstroms thick. The structure is then subjected to a RIE TEOS etch, stopping at the polysilicon layer 72. The resultant operation forms TEOS spacers 78 which abut the unexposed strips of silicon nitride 76. The resultant structure is shown in FIG. 6B.

Figure 6B:
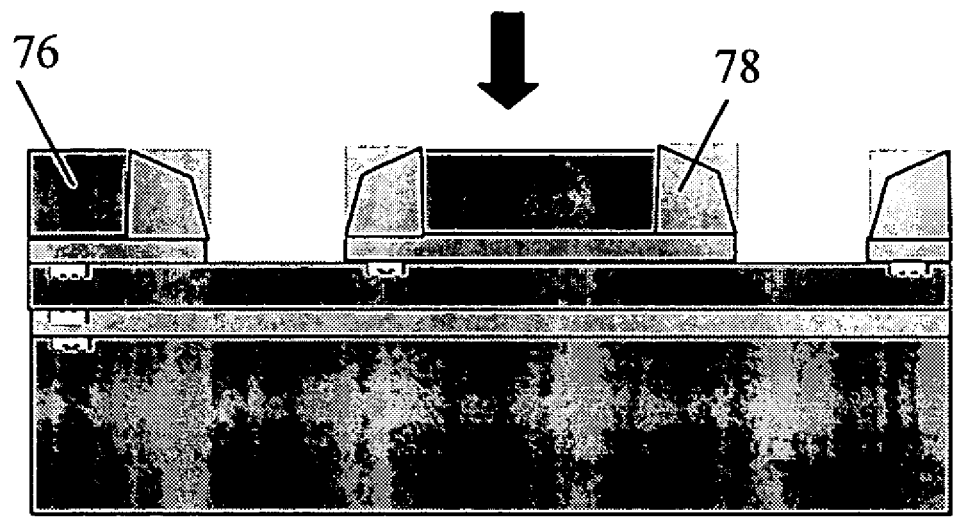

The structure shown in FIG. 6B is then subjected to an RIE polysilicon etch process. The RIE polysilicon etch removes the exposed portion of the polysilicon layer 72, exposing the underlying silicon dioxide layer 70. The structure is then dipped in HF acid to remove the TEOS oxide spacer 78 and the portion of the silicon dioxide layer 74 beneath the TEOS oxide spacer 78. A layer 80 of HTO is then deposited everywhere. The resultant structure is shown in FIG. 6C.

Figure 6C:
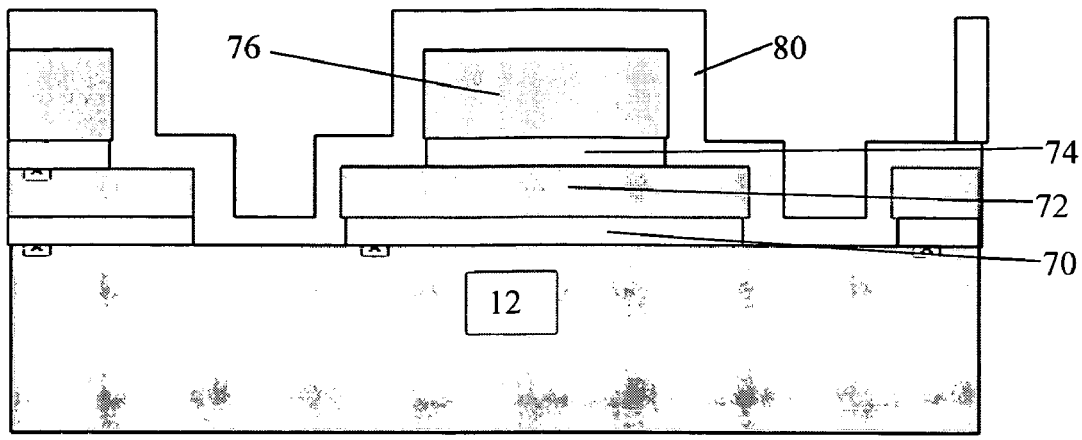

Polysilicon 82 is then deposited everywhere in the structure shown in FIG. 6C. In particular, polysilicon 82 is deposited in the regions between adjacent strips of silicon nitride 76, covered by the HTO oxide 80. The structure is then planarized and polished using CMP, removing the HTO oxide 80 on the silicon nitride 76, until the silicon nitride 76 is exposed and is planar with the exposed surface of the deposited polysilicon 82. The structure is then oxidized. Since the only exposed polysilicon is that region of the polysilicon 82 which is exposed, oxide 84 is formed on the polysilicon 82. The structure is then dipped in HF acid. The resultant structure is shown in FIG. 6D.

Figure 6D:
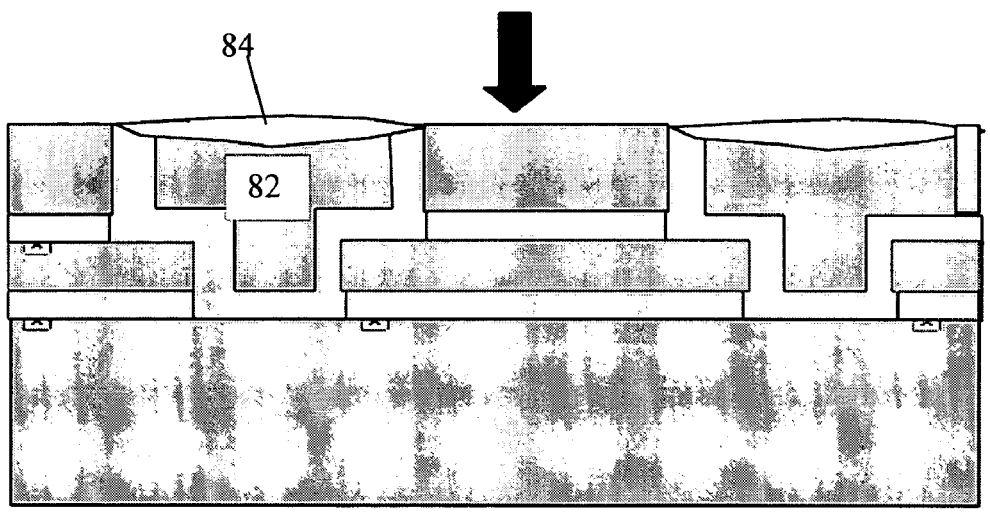
Figure 6E:
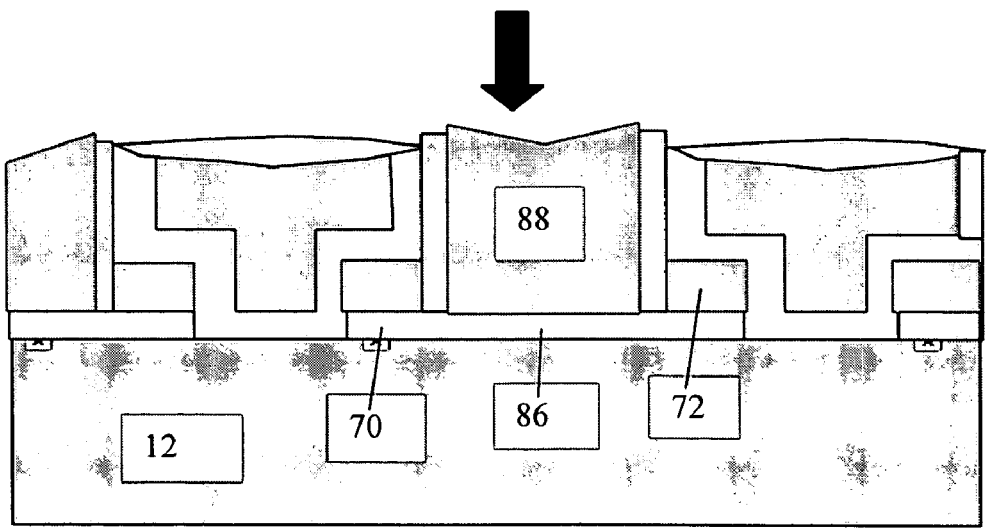

The structure shown in FIG. 6D is dipped in hot phosphoric acid which removes the exposed silicon nitride 76. The structure is then subjected to an RIE oxide etch removing the exposed portion of the layer 74 of silicon dioxide. The structure is then subjected to a RIE polysilicon etch removing exposed portions of the polysilicon 72, leaving two separate portions of polysilicon 72, which will be the pair of floating gates that are adjacent to the first select gate. The structure is then subjected to an RIE oxide etch removing the exposed portions of the silicon dioxide layer 70, reaching the substrate 12. An oxide layer 86 is grown or deposited on the exposed silicon substrate 12. The silicon dioxide layer 86 forms the gate oxide layer for the first select gates. Thus the thickness of the gate oxide 86 for the first select gate 40 can be different from the gate oxide 70 for the floating gate 72. Finally, polysilicon 88 is deposited forming the first select gate 40. The structure is then subjected to a poly etchback operation. The resultant structure is shown in FIG. 6E.

Methods of Operation

Erase Operation No. 1

In a first method of erasing a NAND flash memory structure 30 of the present invention, floating gates 18 that are in the same row are erased at the same time. This is accomplished as follows. Let us assume that the floating gate 18c and those floating gates in the same row are to be erased simultaneously. Then the following voltages are applied. The source region 14 and the drain region 16 are all held at ground. The second select gates 42 are also held at ground. A positive voltage, such as plus eight volts (+8v) is applied to the first select gate 40a which is immediately adjacent to the selected floating gate 18c, while all of the other first select gates 40 are held at ground. Finally, a ground or negative voltage, such as negative ten volts (−10v), is applied to the control gate 34b which is immediately adjacent to the selected floating gate 18c, on the other side of the first select gate 40a, while ground voltage is applied to all of the other control gates 34. The result is that the negative voltage from the control gate 34b will repel the electrons on the floating gate 18c, while the positive voltage on the first select gate 40a will attract the electrons stored on the floating gate 18c. The electrons will tunnel through the mechanism of Fowler-Nordheim from the floating gate 18c to the first select gate 40a. Because each of the first select gates 40a and the control gate 34b extend in the row direction, all of the floating gates 18c in the same row will be erased at the same time.

In a variation of the foregoing method, if a negative voltage, such as negative ten volts (−10v) were applied to the control gate 34a, which is on the other side of the floating gate 18b, which is adjacent to the first select gate 40a, then all of the floating gates in the same row as the floating gates 18b will also be erased. Thus, in this variation, two rows of floating gates (18a and 18b) can be erased simultaneously.

Erase Option No. 2

In this method of erasing a NAND structure 30, The source region 14 and the drain region 16 are all held at ground. The second select gates 42 are also held at ground. All of the first select gates 40 are held at ground. A negative voltage, such as negative ten volts (−10v), is applied to the control gates 34 in each NAND structure 30. A positive voltage, such as plus ten volts (+10 v) is applied to the substrate 12. All of then floating gates 18 in the NAND structure are erased at the same time. In this mode of operation, however, the structure has to be of triple well construction so that different wells can be formed in the substrate 12 so that only portions of the array 50 is erased at the same time. For example, if the NAND structures 30 (30a-30p) shown in FIG. 3 on the left side were made in one triple well, and the NAND structures 30 (30q-30af) shown in FIG. 3 on the right side were made in another triple well, then one can erase simultaneously all of the floating gates 18 in the NAND structures (30a-30p) by applying a positive voltage to that well, while keeping the voltage to the well for the NAND structures (30q-30af) at ground. In this manner of erase, the electrons from the floating gates 18 are tunneled through the gate oxide 70 into the substrate 12 (or the well of the substrate 12).

Programming

The basic mechanism of programming for the NAND flash memory structure 30 of the present invention is by the mechanism of source side hot electron injection or mid-channel hot electron injection. Assume now that the floating gate 18c is to be programmed. Then the voltages applied are as follows. The source region 14 is held at ground. A positive voltage, such as +4.5 volts is applied to the drain region 16. A positive voltage, such as +6 volts is applied to the second gates 42a and 42b; so that the channel regions beneath those second select gates are turned on. The control gate 34b, which is immediately adjacent to the selected floating gate 18c is applied with a voltage of 7-11 volts, while all of the rest of the control gates is applied with +10 volts. The +10 volts applied to all the other control gates, such as 34a, 34c, 34d etc., is sufficient to cause the channel region underneath the floating gates to which these control gates are capacitively coupled to turn on, irrespective of whether these floating gates are charged or not. The first select gate 40a which is immediately adjacent to the selected floating gate 18c is applied with a positive voltage of +1.5 volts, while all of the other first select gates 40 are applied with +6 volts. The application of +1.5 volts turns on weakly the channel region beneath that first select gate 40a, while the application of +6 volts to all the other first select gates 40 strongly turns on the channel region beneath those first select gates 40. As a result, programming of the selected floating gate 18c occurs in the following manner.

Electrons are attracted from the source region 14 to the drain region 126, since all of the regions of the channel 32 are turned on. As the electrons approach the portion of the channel region 32 beneath the first select gate 40a, that portion of the channel region is weakly turned on. However, because of the strong capacitive coupling between the floating gate 18c and the control gate 34b, and the large voltage applied to the control gate 34b, the electrons in the channel region 32 beneath the select gate 40a "sees" a strong positive voltage on the selected floating gate 18c. Thus, electrons are accelerated to the floating gate 18c, and are injected across the gate oxide region 60, thereby programming the selected floating gate 18c.

As can be seen by FIG. 3, adjacent NAND flash memory structures 30 in the row direction share a common source region 14 to one side and a common drain region 16 to another side. To minimize programming disturbance on adjacent NAND flash memory structures 30, the voltages applied to the other source regions 14 and drain regions 16 as follows. Let us assume that the selected floating gate 18c is from the selected NAND flash memory structure 30c. Then the voltages applied are: ground voltage applied to source region 14c, +4.5 volts applied to the drain region 16c, and 2.5 volts applied to source region 14e. The application of +2.5 volts to the source region 14e, minimizes the programming disturbance to the NAND flash memory structure 30d. Finally, all of the other source regions 14 and drain regions 16 are held at ground.

The NAND flash memory structure 30 is bi-directional. Thus, programming can also occur in a direction opposite to that shown and described above, to program, for example, the floating gate 18d. To program the floating gate 18d, the following voltages are applied: The drain region 16 is held at ground. A positive voltage, such as +4.5 volts is applied to the source region 14. A positive voltage, such as +6 volts is applied to the second gates 42a and 42b, so that the channel regions beneath those second select gates are turned on. The control gate 34b, which is immediately adjacent to the selected floating gate 18d is applied with a voltage of 7-11 volts, while all of the rest of the control gates is applied with +10 volts. The +10 volts applied to all the other control gates, such as 34a, 34c, 34d etc., is sufficient to cause the channel region underneath the floating gates to which these control gates are capacitively coupled to turn on, irrespective of whether these floating gates are charged or not. The first select gate 40b which is immediately adjacent to the selected floating gate 18d is applied with a positive voltage of +1.5 volts, while all of the other first select gates 40 are applied with +6 volts. The application of +1.5 volts turns on weakly the channel region beneath that first select gate 40b, while the application of +6 volts to all the other first select gates 40 strongly turns on the channel region beneath those first select gates 40. The action of mid-channel hot electron injection, which is same as that described before, will then occur, causing electrons from the drain region 16 to be injected onto the floating gate 18d.

Read Operation

Read Option No. 1

The first option to read a selected floating gate is through the mechanism of voltage sensing. Assume now that it is desired to read floating gate 18c. The voltages applied are as follows: A positive voltage such as +1.5 volts is applied to the drain region 16. The voltage at the source 14 is sensed under a load of −100 nanoamperes. A positive voltage of +4 volts is applied to the second select gates 42a and 42b. A positive voltage of, for example +1.5 volts, is applied to the control gate 34b, which is immediately adjacent to the selected floating gate 18c, while a positive voltage of +4.0 volts is applied to all of the other control gates 34. The voltage of +4 volts is sufficient to turn on the portion of the channel region 32 underneath the floating gates 18 with which the control gates 34 are associated, irrespective of the state of charge of the floating gates 18. The voltage of +1.5 volts is sufficient to turn on the portion of the channel region 32 underneath the selected floating gate 18c in the event the selected floating gate 18c is not programmed. However, if the selected floating gate 18c is programmed, the voltage of +1.5 volts is insufficient o turn on the portion of the channel region 32 underneath the selected floating gate 18c or turns it on very weakly. A large positive voltage, such as +7 volts is applied to the first select gate 40b which is immediately adjacent to the floating gate 18d which along with the selected floating gate 18c is capacitively coupled to the control gate 34b. The large positive voltage on the first select gate 40b is sufficient to cause the portion of the channel region underneath the floating gate 18d to turn on, even if the floating gate 18d is programmed. All of the other first select gates 40 are supplied with a voltage of +1.5 volts which is sufficient to turn on the portion of the channel region 32 underneath those first select gates 40.

In operation, the voltage at the source region 14 is sensed. The voltage is dependent upon whether the selected floating gate 18c is programmed or not.

To minimize read disturbance on adjacent NAND flash memory structures 30, the voltages are as follows. Assume that the selected NAND structure is structure 30c. Then the voltage applied are: voltage sensing occurs at source region 14c, +1.5 volts is applied at drain region 16c, 0 volts is applied to all other drain regions 16, the source region 14e is held floating, and all other source regions 14 are applied with ground voltage.

The NAND flash memory structure 30 is capable of being read bi-directionally. Thus to read the floating gate 18d, the voltages applied are as follows: A positive voltage such as +1.5 volts is applied to the source region 14. The voltage at the drain region 16 is sensed under a load of −100 nanoamperes. A positive voltage of +4 volts is applied to the second select gates 42a and 42b. A positive voltage of, for example +1.5 volts, is applied to the control gate 34b, which is immediately adjacent to the selected floating gate 18d, while a positive voltage of +4.0 volts is applied to all of the other control gates 34. The voltage of +4 volts is sufficient to turn on the portion of the channel region 32 underneath the floating gates 18 with which the control gates 34 are associated, irrespective of the state of charge of the floating gates 18. The voltage of +1.5 volts is sufficient to turn on the portion of the channel region 32 underneath the selected floating gate 18d in the event the selected floating gate 18d is not programmed. However, if the selected floating gate 18d is programmed, the voltage of +1.5 volts is insufficient o turn on the portion of the channel region 32 underneath the selected floating gate 18d or turns it on very weakly. A large positive voltage, such as +7 volts is applied to the first select gate 40a which is immediately adjacent to the floating gate 18c which along with the selected floating gate 18c is capacitively coupled to the control gate 34b. The large positive voltage on the first select gate 40a is sufficient to cause the portion of the channel region underneath the floating gate 18c to turn on, even if the floating gate 18c is programmed. All of the other first select gates 40 are supplied with a voltage of +1.5 volts which is sufficient to turn on the portion of the channel region 32 underneath those first select gates 40.

Read Option No. 2

The second option to read a selected floating gate is through the mechanism of current sensing. Assume now that it is desired to read floating gate 18c. The voltages applied are as follows: A positive voltage such as +1.0 volts is applied to the drain region 16, and zero volts at the source region 14. The current flowing at the drain region 16 is sensed. A positive voltage of +3 volts is applied to the second select gates 42a and 42b. A positive voltage of, for example +1.5 volts, is applied to the control gate 34b, which is immediately adjacent to the selected floating gate 18c, while a positive voltage of +4.0 volts is applied to all of the other control gates 34. The voltage of +4 volts is sufficient to turn on the portion of the channel region 32 underneath the floating gates 18 with which the control gates 34 are associated, irrespective of the state of charge of the floating gates 18. The voltage of +1.5 volts is sufficient to turn on the portion of the channel region 32 underneath the selected floating gate 18c in the event the selected floating gate 18c is not programmed. However, if the selected floating gate 18c is programmed, the voltage of +1.5 volts is insufficient o turn on the portion of the channel region 32 underneath the selected floating gate 18c or turns it on very weakly. A large positive voltage, such as +5 volts is applied to the first select gate 40b which is immediately adjacent to the floating gate 18d which along with the selected floating gate 18c is capacitively coupled to the control gate 34b. The large positive voltage on the first select gate 40b is sufficient to cause the portion of the channel region 32 underneath the floating gate 18d to turn on, even if the floating gate 18d is programmed. All of the other first select gates 40 are supplied with a voltage of +1.5 volts which is sufficient to turn on the portion of the channel region 32 underneath those first select gates 40.

In operation, the current at the drain region 16 is sensed. The current is dependent upon whether the selected floating gate 18c is programmed or not.

To minimize read disturbance on adjacent NAND flash memory structures 30, the voltages are as follows. Assume that the selected NAND structure is structure 30c. Then the voltage applied are: +1.0 volts is applied at drain region 16c, 0 volts is applied to all other drain regions 16, the source region 14c is held at ground, while the source region 14e is supplied with +1.5 volts. Thus, no current flows in the NAND structure 30d. All other source regions 14 are applied with ground voltage.

The NAND flash memory structure 30 is capable of being read bi-directionally. Thus to read the floating gate 18d, the voltages applied are as follows: A positive voltage such as +1.0 volts is applied to the source region 14, and zero volts at the drain region 16. The current flowing at the source region 14 is sensed. A positive voltage of +3 volts is applied to the second select gates 42a and 42b. A positive voltage of, for example +1.5 volts, is applied to the control gate 34b, which is immediately adjacent to the selected floating gate 18d, while a positive voltage of +4.0 volts is applied to all of the other control gates 34. The voltage of +4 volts is sufficient to turn on the portion of the channel region 32 underneath the floating gates 18 with which the control gates 34 are associated, irrespective of the state of charge of the floating gates 18. The voltage of +1.5 volts is sufficient to turn on the portion of the channel region 32 underneath the selected floating gate 18d in the event the selected floating gate 18c is not programmed. However, if the selected floating gate 18d is programmed, the voltage of +1.5 volts is insufficient o turn on the portion of the channel region 32 underneath the selected floating gate 18c or turns it on very weakly. A large positive voltage, such as +5 volts is applied to the first select gate 40a which is immediately adjacent to the floating gate 18c which along with the selected floating gate 18d is capacitively coupled to the control gate 34b. The large positive voltage on the first select gate 40a is sufficient to cause the portion of the channel region 32 underneath the floating gate 18c to turn on, even if the floating gate 18c is programmed. All of the other first select gates 40 are supplied with a voltage of +1.5 volts which is sufficient to turn on the portion of the channel region 32 underneath those first select gates 40.

Other Embodiments of the NAND Structure

Figure 7:
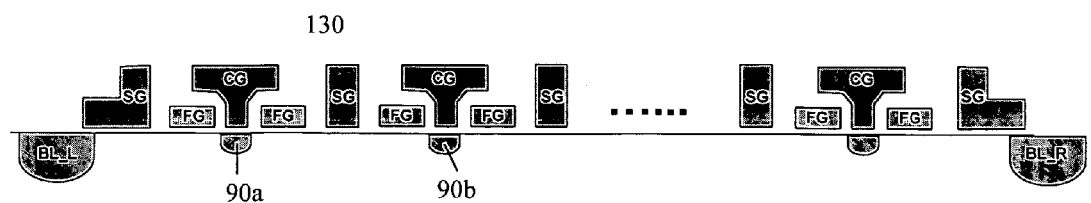
FIG. 7 is a schematic cross-sectional view of a variation of the NAND flash memory structure of the present invention shown in FIG. 2.

Referring to FIG. 7, there is shown a cross sectional view of another embodiment of a NAND flash memory structure 130 of the present invention. The structure 130 is similar to the structure 30 shown and described in FIG. 2. The only difference between the structure 130 and the structure 30 is that with the structure 130, additional second regions 90(a-n) are in the channel region 32 between the source region 14 and the drain region 16. Each of these additional regions 90(a-n) is underneath a the first portion 36 of the control gate 34. The control gate 34 however remains insulated from the substrate 12, and the channel region 32. With the addition of these second regions 90, the flow of the electrons in the channel region 32 between the source region 14 and the drain region 16 can be more finely controlled. These regions can extend in the row direction parallel to the control gate 34 and the first select gates 40.

Figure 8:
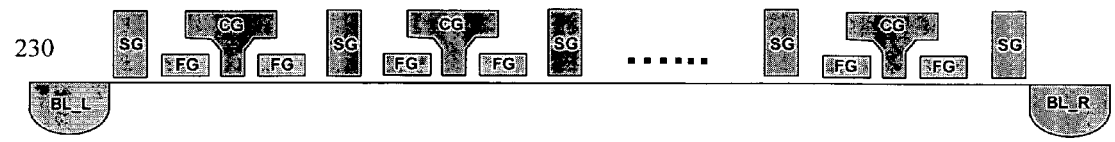
FIG. 8 is a schematic cross-sectional view of another embodiment of a NAND flash memory structure of the present invention, which is another variation of the embodiment shown in FIG. 2.

Referring to FIG. 8, there is shown a cross sectional view of yet another embodiment of a NAND flash memory structure 230 of the present invention. The structure 230 is similar to the structure 30 shown and described in FIG. 2. The only difference between the structure 230 and the structure 30 is that in the structure 230, the second control gates 42, immediately adjacent to the source region 14 and the drain region 16, are also rectilinearly shaped, similar to the first control gates 40.

Figure 9:
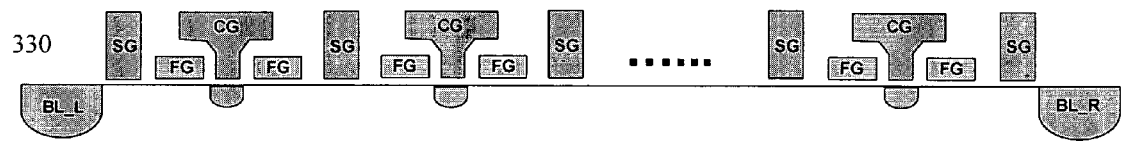
FIG. 9 is a schematic cross-sectional view of an embodiment of a NAND flash memory structure similar to the NAND flash memory structure shown in FIGS. 7 and 8.

Referring to FIG. 9, there is shown a cross sectional view of another embodiment of a NAND flash memory structure 330 of the present invention. The structure 330 is similar to the structures 30/130/230 shown and described in FIGS. 2/7/8. Similar to the structure 130 shown and described in FIG. 7, the structure 330 has a plurality of second regions 90(a-n) between the source region 14 and the drain region 16. Further, similar to the structure 230 shown and described in FIG. 8, the structure 330 has second select gates 42 that are substantially rectilinearly shaped.

Figure 10:
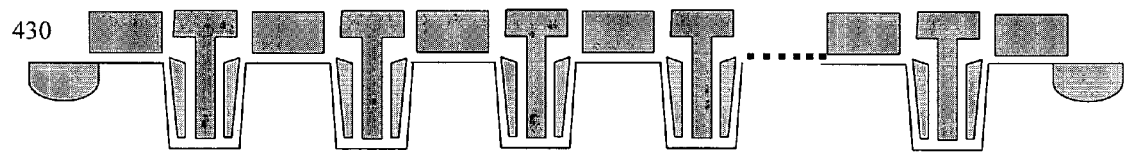
FIG. 10 is a schematic cross-sectional view of yet another embodiment of a NAND flash memory structure of the present invention.

Referring to FIG. 10, there is shown a cross sectional view of another embodiment of a NAND flash memory structure 430 of the present invention. The structure 430 is similar to the structure 230 shown and described in FIGS. 8. The only difference between the structure 430 and the structure 430 is that the floating gates 18 and the associated control gate 34 are in a trench. In contrast, in the structure 230, all of the control gates, first and second select gates, and floating gates are on the planar surface of the silicon substrate.

Figure 11:
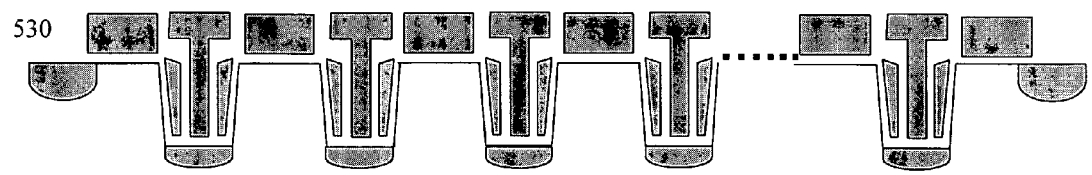
FIG. 11 is a schematic cross-sectional view of a variation of the embodiment of the NAND flash memory structure of the present invention shown in FIG. 10.

Referring to FIG. 11, there is shown a cross sectional view of another embodiment of a NAND flash memory structure 530 of the present invention. The structure 530 is similar to the structures 430 shown and described in FIGS. 10, and the structure 130 shown in FIG. 7. The structure 530, similar to the structure 430, has the floating gates 18 and the associated control gates 34 in trenches. In addition, the structure 530 has a plurality of second regions 90, with each region 90 being along the bottom of each trench, similar to the second region 90 being along the bottom of the first portion 36 of the control gate 34, shown and described in FIG. 7.

Figure 12:
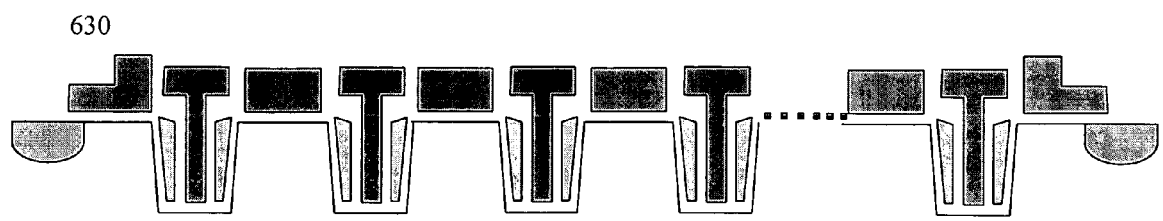
FIG. 12 is a schematic cross-sectional view of a variation of the embodiment of the NAND flash memory structure of the present invention shown in FIG. 10.

Referring to FIG. 12, there is shown a cross sectional view of another embodiment of a NAND flash memory structure 630 of the present invention. The structure 630 is similar to the structures 430 shown and described in FIGS. 10. The only difference is that in the structure 630, the second select gates 42 are "L" shaped, whereas the second select gates 42 in the structure 430 shown in FIG. 10 are rectilinearly shaped.

Figure 13:
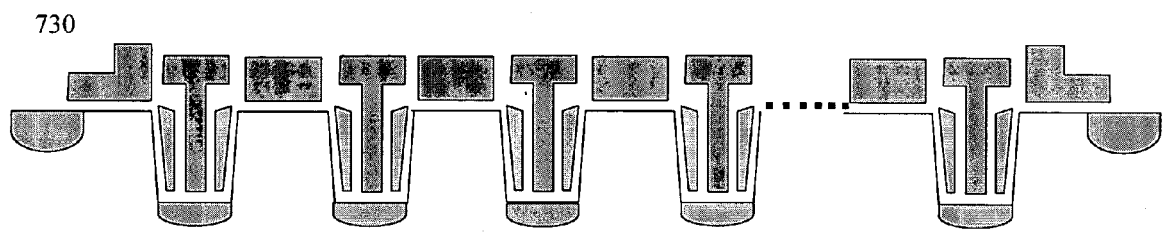
FIG. 13 is a schematic cross-sectional view of a variation of the embodiment of the NAND flash memory structure of the present invention shown in FIGS. 11 and 12.

Referring to FIG. 13, there is shown a cross sectional view of another embodiment of a NAND flash memory structure 730 of the present invention. The structure 730 is similar to the structures 630 shown and described in FIGS. 12, and the structure 530 shown and described in FIG. 11. The only difference between the structure 730 and the structure 630 is the addition of a plurality of second regions 90 at the bottom wall of each trench, similar to the structure 530.

As can be seen from the foregoing, a bi-directional high density NAND flash memory structure and array comprising of split gate memory cells is disclosed.

What is claimed is:

1. A method of erasing a plurality of floating gates arranged in a first row direction in an array of NAND flash memory structures, said array formed in a semiconductor substrate of a first conductivity type and having a plurality of NAND structure with each structure having a first region of a second conductivity type in the substrate; a second region of the second conductivity type in the substrate, spaced apart from the first region in a column direction, forming a channel region therebetween; with the column direction substantially perpendicular to the first row direction; a plurality of floating gates, spaced apart from one another, each insulated from the substrate; each NAND structure further having a control gate insulated from the substrate, the control gate being between a pair of floating gates and being capacitively coupled to the pair of floating gates; with a select gate insulated from the substrate, the select gate being between a pair of floating gates; whereby a floating gate is between a select gate and a control gate, and wherein the NAND structures adjacent to one another in the row direction, have the select gate connected to one another in the row direction, and the control gate connected to one another in the row direction; said method of erasing comprising
applying a negative voltage to a selected row of control gates immediately adjacent to one side of the select plurality of floating gates in the select row; and
applying a positive voltage to a selected row of select gates immediately adjacent to another side of the select plurality of floating gates in the select row;
wherein the first row of floating gates between the selected row of control gate and the selected row of select gates are erased by charges from the first row of floating gates tunneling to the selected row of select gates.

2. The method of claim 1 further comprising applying ground voltage to all the rows of control gates not selected and applying ground voltage to all the rows of select gates not selected.

3. The method of claim 2 further comprising applying a ground voltage to the first region and a ground voltage to the second region.

4. The method of claim 1 further comprising:
applying a negative voltage to a row of control gates immediately adjacent to a side of a second row of floating gates, other than the first row of floating gates, wherein said second row of floating gates is immediately adjacent to the row of select gates to which a positive voltage is applied;
wherein said first row of floating gates and second row of floating gates are erased simultaneously by charges from the first and second rows of floating gates tunneling to the selected row of select gates.

5. A method of erasing a plurality of floating gates arranged in a first row direction in an array of NAND flash memory structures, said array formed in a semiconductor substrate of a first conductivity type and having a plurality of NAND structure with each structure having a first region of a second conductivity type in the substrate; a second region of the second conductivity type in the substrate, spaced apart from the first region in a column direction, forming a channel region therebetween; with the column direction substantially perpendicular to the first row direction; a plurality of floating gates, spaced apart from one another, each insulated from the substrate; each NAND structure further having a control gate insulated from the substrate, the control gate being between a pair of floating gates and being capacitively coupled to the pair of floating gates; with a select gate insulated from the substrate, the select gate being between a pair of floating gates; whereby a floating gate is between a select gate and a control gate, and wherein the NAND structures adjacent to one another in the row direction, have the select gate connected to one another in the row direction, and the control gate connected to one another in the row direction; said method of erasing comprising
applying a negative voltage to a selected row of control gates immediately adjacent to one side of the select plurality of floating gates in the select row; and
applying a positive voltage to the substrate;
wherein the first row of floating gates adjacent to the selected row of control gates are erased by charges from the first row of floating gates tunneling to the substrate.

6. The method of claim 5 further comprising applying ground voltage to all the rows of control gates not selected and applying ground voltage to all the rows of select gates not selected.

7. The method of claim 6 further comprising applying a ground voltage to the first region and a ground voltage to the second region.

8. A method of reading a select floating gate, in an array of NAND flash memory structures, said array formed in a semiconductor substrate of a first conductivity type and having a plurality of NAND structure with each NAND structure having a first region of a second conductivity type in the substrate; a second region of the second conductivity type in the substrate, spaced apart from the first region in a column direction, forming a continuous channel region therebetween; a plurality of floating gates, spaced apart from one another, each insulated from the substrate; each NAND structure further having a control gate insulated from the substrate, the control gate being between a pair of floating gates and being capacitively coupled to the pair of floating gates; with a select gate insulated from the substrate, the select gate being between a pair of floating gates; whereby a floating gate is between a select gate and a control gate, and wherein the NAND structures adjacent to one another in a row direction, have the select gate connected to one another in the row direction, and the control gate connected to one another in the row direction; wherein said row direction is substantially perpendicular to said column direction, said method of reading comprising
applying a first voltage to the first region;
applying a second voltage to each of the control gates other than a first control gate between the two floating gates, one of which is the select floating gate; said second voltage sufficient to turn on the portions of the channel region over which the floating gates, associated with the control gates, are positioned irrespective of the state of the floating gates;
applying the second voltage to each of the select gates, other than the two select gates which are immediately adjacent to the two floating gates of which the first control gate is therebetween;
applying a third voltage to said first control gate; said third voltage sufficient to turn on the portion of the channel region over which the select floating gate is positioned, either strongly or weakly depending upon whether the select floating gate is erased or programmed;

applying the third voltage to the select gate which is immediately adjacent to the select floating gate;

applying a fourth voltage to the select gate which is immediately adjacent to the non-select floating gate which is the floating gate other than the select floating gate that is immediately adjacent to the first control gate; said fourth voltage sufficient to turn on the portion of the channel region over which the non-select floating gate is positioned, irrespective of whether the non-select floating gate is programmed or erased; and sensing the voltage at the second region to determine the state of said select floating gate.

9. A method of reading a select floating gate, in an array of NAND flash memory structures, said array formed in a semiconductor substrate of a first conductivity type and having a plurality of NAND structure with each NAND structure having a first region of a second conductivity type in the substrate; a second region of the second conductivity type in the substrate, spaced apart from the first region in a column direction, forming a continuous channel region therebetween; a plurality of floating gates, spaced apart from one another, each insulated from the substrate; each NAND structure further having a control gate insulated from the substrate, the control gate being between a pair of floating gates and being capacitively coupled to the pair of floating gates; with a select gate insulated from the substrate, the select gate being between a pair of floating gates; whereby a floating gate is between a select gate and a control gate, and wherein the NAND structures adjacent to one another in a row direction, have the select gate connected to one another in the row direction, and the control gate connected to one another in the row direction; wherein said row direction is substantially perpendicular to said column direction, said method of reading comprising applying a first voltage to the first region;

applying a second voltage to the second region;

applying a third voltage to each of the control gates other than a first control gate between the two floating gates, one of which is the select floating gate; said third voltage sufficient to turn on the portions of the channel region over which the floating gates, associated with the control gates, are positioned irrespective of the state of the floating gates;

applying a fourth voltage to each of the select gates, other than the two select gates which are immediately adjacent to the two floating gates of which the first control gate is therebetween;

applying a fifth voltage to said first control gate; said fifth voltage sufficient to turn on the portion of the channel region over which the select floating gate is positioned, either strongly or weakly depending upon whether the select floating gate is erased or programmed;

applying the fifth voltage to the select gate which is immediately adjacent to the select floating gate;

applying a sixth voltage to the select gate which is immediately adjacent to the non-select floating gate which is the floating gate other than the select floating gate that is immediately adjacent to the first control gate; said sixth voltage sufficient to turn on the portion of the channel region over which the non-select floating gate is positioned, irrespective of whether the non-select floating gate is programmed or erased; and sensing the current at the second region to determine the state of said select floating gate.

10. A method of programming a select floating gate in a first NAND structure, in an array of NAND flash memory structures, said array formed in a semiconductor substrate of a first conductivity type and having a plurality of like NAND structure with said first NAND structure having a first region of a second conductivity type in the substrate; a second region of the second conductivity type in the substrate, spaced apart from the first region in a column direction, forming a continuous channel region therebetween; a plurality of floating gates, spaced apart from one another, each insulated from the substrate; said first NAND structure further having a control gate insulated from the substrate, the control gate being between a pair of floating gates and being capacitively coupled to the pair of floating gates; with a select gate insulated from the substrate, the select gate being between a pair of floating gates; whereby a floating gate is between a select gate and a control gate, and wherein the NAND structures adjacent to one another in a row direction, have the select gate connected to one another in the row direction, and the control gate connected to one another in the row direction; wherein said row direction is substantially perpendicular to said column direction, said method of programming comprising:

applying a first voltage to the first region;

applying a second voltage to the second region;

applying a third voltage to each of the control gates other than a first control gate between the two floating gates, one of which is the select floating gate; said third voltage sufficient to turn on the portions of the channel region over which the floating gates, associated with the control gates, are positioned irrespective of the state of the floating gates;

applying a fourth voltage to each of the select gates, other than the two select gates which are immediately adjacent to the two floating gates of which the first control gate is therebetween; said fourth voltage sufficient to turn on the portion of the channel region over which the select gates are position;

applying a fifth voltage to said first control gate; said fifth voltage sufficient to turn on the portion of the channel region over which the select floating gate is positioned;

applying a sixth voltage to the select gate which is immediately adjacent to the select floating gate; said sixth voltage sufficient to turn on the portion of the channel region over which the select gate is positioned, with said sixth voltage lower than said fourth voltage; and applying a said fourth voltage to the select gate which is immediately adjacent to the non-select floating gate which is the floating gate other than the select floating gate that is immediately adjacent to the first control gate.

11. The method of programming of claim 10 wherein said sixth voltage is applied to the select gate which is to one side of the select floating gate with the first control gate to another side of the select floating gate.

12. The method of programming of claim 11 wherein said first region is to said one side of said select floating gate; and said second region is to said another side of the select floating gate; and wherein said first voltage is lower than said second voltage.

13. The method of claim 12 wherein said second region of said first NAND structure is connected in common to a second region of a second NAND structure immediately adjacent to the first NAND structure in said row direction.

14. The method of claim 13 further comprising applying a seventh voltage to said first region of said second NAND structure, wherein said seventh voltage is greater than said first voltage but less than said second voltage.

* * * * *